(12) United States Patent
Soule

(10) Patent No.: US 6,861,293 B2
(45) Date of Patent: Mar. 1, 2005

(54) STACKED FIN HEAT SINK AND METHOD OF MAKING

(75) Inventor: Christopher Soule, Bow, NH (US)

(73) Assignee: Thermshield, L.L.C., Laconia, NH (US)

( * ) Notice: Subject to any disclaimer, the term of this patent is extended or adjusted under 35 U.S.C. 154(b) by 0 days.

(21) Appl. No.: 10/386,379

(22) Filed: Mar. 11, 2003

(65) Prior Publication Data

US 2003/0209800 A1 Nov. 13, 2003

Related U.S. Application Data

(60) Provisional application No. 60/363,253, filed on Mar. 11, 2002.

(51) Int. Cl.$^7$ .......................... H01L 21/44; H01L 21/48
(52) U.S. Cl. .................................... 438/122; 438/123
(58) Field of Search ................................ 438/122–123, 438/121; 257/706, 675, 722, 717; 165/185

(56) References Cited

U.S. PATENT DOCUMENTS 6,050,332 A * 4/2000 Smith et al. ................. 165/185

OTHER PUBLICATIONS

Provisional U.S. Appl. No. 60/363,253, filed Mar. 11, 2002.*

* cited by examiner

*Primary Examiner*—Phat X. Cao
*Assistant Examiner*—Theresa T. Doan
(74) *Attorney, Agent, or Firm*—Michael J. Persson; Lawson & Persson, P.C.

(57) ABSTRACT

A heat sink and method of making the same. The heat sink includes a plurality of substantially planar fins, each of substantially uniform thickness, which are stacked together in alternating relation to one another. Each fin includes a base portion, a top portion, a fin side and a base side, with the base side of each fin being joined to the base side of adjacent fins to form a substantially planar surface. The base side of each fin is dimensioned to form a space between the top portions of adjoining fins, the space being of a dimension that is substantially equal to the thickness of the fin. The method includes the steps of forming a plurality of substantially planar fins of a substantially uniform thickness, stacking the fins together in alternating relation to one another, and joining the stacked fins together to form the heat sink.

20 Claims, 5 Drawing Sheets

STACKED FIN HEAT SINK AND METHOD OF MAKING

CLAIM OF PRIORITY

This application claims the benefit of priority of U.S. Provisional Patent Application Ser. No. 60/363,253, filed Mar. 11, 2002.

FIELD OF THE INVENTION

The present invention relates to the field of thermal management devices and, in particular, to heat sinks having high fin densities and to methods of manufacturing the same.

BACKGROUND OF THE INVENTION

Semiconductors and other electrical components generate heat as a by-product of their operation. As technology has advanced, the amount of heat to be dissipated from many of these components has risen dramatically while the acceptable cost of heat dissipating devices has remained constant or, in many cases, has dropped. Consequently, the art of heat sinking to cool heat-dissipating components has continually evolved to meet these new market requirements.

Finned metal heat sinks have traditionally been utilized to dissipate heat generated by electrical components. These finned metal heat sinks typically include a substantially rectangular base unit to which the heat generating electronic devices are mounted, and a plurality of fins projecting from the base unit for dissipating the generated heat. In many applications, a fan is utilized to force cooling air across the fins of the heat sink in order to enhance cooling from the heat sinks. In these applications, the amount of heat that may be dissipated from the heat sink at a given air velocity is directly related to the surface area exposed to the airflow. Thus, heat sink designers have striven to maximize the surface area of the fins in order to provide optimum heat transfer from the heat sink to the surrounding atmosphere.

Heat sinks have traditionally been fabricated by extruding aluminum through a die, which is cut to the required shape specifications such that the base unit and fins are of integral construction. Commercial extrusion processes have typically been limited to aspect ratios, defined as the ratio of fin height to spacing between fins, in the range of 16:1, effectively limiting the achievable surface area for a given volume heat sink. However, the surface area requirements in many applications have exceeded the maximum achievable surface area for extruded heat sinks. Thus, there has been a need for an alternative method of fabricating heat sinks that will allow these increased surface area requirements to be met.

One common alternative method has been to extrude a base plate with a plurality of grooves and to bond sheet metal fins into these grooves via a thermally conductive epoxy. This method allows heat sinks having high fin densities to be fabricated, but has a number of significant drawbacks. First, both the base and fins must be meticulously cleaned and etched prior to bonding in order to obtain a strong bonded joint between the parts. Second, even epoxies heavily loaded with conductive materials such as aluminum oxide do not possess the thermal conductivity of a metal to metal joint, resulting in significant conduction losses through the base to the fins. Third, epoxies are not electrically conductive and, therefore, the finished heat sinks may not be effectively anodized, as the electricity required for the anodization process cannot pass through the base to the fins. Finally, the epoxy bonding process requires that fins be inserted within the grooves in the extrusion and carefully fixtured prior to curing, adding significantly to the overall cost of these heat sinks.

Another method involves the use of a horizontal milling machine to form a finned heat sink by milling a plurality of parallel slots in a solid piece of metal to form a plurality of fins. This method overcomes many of the drawbacks of bonded fin heat sinks, but has drawbacks of its own. First, this process wastes significant amounts of aluminum, resulting in significant scrap costs. Second, tooling costs for such a process are high as milling inserts must be replaced on a regular basis. Finally, this process often results in significant metal burrs, which must be removed in a secondary operation after milling.

A number of patents have sought to address the need for an alternative heat sink fabrication method. For example, U.S. Pat. No. 3,216,496, issued to Katz, discloses a base unit having a plurality of slots for receiving separately fabricated fins. The slots extend transversely the length of the bar and are arranged so as to hold the fins in substantially parallel relationship. The fins are joined to the base by inserting the fins into the slots and swaging the material between adjoining slots into intimate contact with the fins utilizing a knife edged tool attached to a high pressure hydraulic press. Unfortunately, the method of Katz utilizes a tool extending along the entire length of the fin and, thus, requires a large amount of force to be applied to the tool. As this is the case, large, noisy, and expensive presses must be utilized to perform the task. Further, this process has been known to lift the fins upwardly from the grooves, leaving an air space at the bottom of the grooves in the bus bar, which allows for air and moisture to enter resulting in corrosion and reducing the thermal contact between the base unit and fins.

U.S. Pat. No. 5,638,715, issued to Lipinski, discloses a method for fabricating high fin density heat sinks from a plurality of fins, each having a bottom portion of generally bell-bottom shape, and a base unit having a plurality of mating dovetail features by utilizing a plurality of rollers to apply pressure on opposite sides of the fin for providing downward and inward swaging against a dovetail joint. The method includes the steps of placing the plurality of fins loosely in respective ones of the grooves, and applying downward and horizontal pressure to the base unit intermediate respective ones of the fins for swaging the base unit and urging the fins downwardly into the respective ones of the grooves.

The method of Lipinski results in heat sinks having increased aspect ratios over what is commercially available. However, there are a number of drawbacks to this method of fabrication. First, the requirement that the bottom of each fin be bell shaped requires that extruded fins be utilized. This requirement increases the cost over what can be achieved utilizing sheet aluminum and decreases the ability of the designer to customize the height of the fins to the exact requirements of the user, as can be accomplished by slitting sheet aluminum fins. Second, the mating dovetail details on the base unit require that the base plates by extruded as well, again reducing the flexibility of designers. In addition, the arrangement of the extruded dovetail details is also limited by the extricable limits on aspect ratios, limiting the minimum fin spacing and creating yet another limitation on achievable surface area in a given volume. Finally, the compounding of extrusion tolerances between the fins and base results in the same discontinuities in fin to base joints as were found in Katz and, as in Katz, allowing air and moisture to enter resulting in corrosion and reducing the thermal contact between the base unit and fins.

Yet another known process involves the staking of fins into a plurality of parallel mating details in a heat sink base. This process operates in a manner similar to a common stapler, with a dual pronged end of an extruded fin being forced into the heat sink base at a force sufficient to deform the end, attaching the fin to the base unit. As was the case with the method of Lipinski, both the fin and base must be extruded, resulting in the same drawbacks. Further, as this process does not utilize a dovetail joint, the fins have tendency to loosen if subjected to vibration or corrosive environments, resulting in a significant reduction of thermal contact between the base unit and fins. Finally, as was the case with the process of Katz, this process requires that a significant amount of force be applied to the fins and, consequently, large, noisy, and expensive presses must be utilized to perform the task.

In addition to finned heat sinks, a number of designers have turned to heat sinks utilizing a plurality of pins extending from a base plate. These pin fin heat sinks have traditionally been manufactured either by casting or by extruding a finned heat sink and cross cutting the fins to create pins. Although these processes allow the surface area of a heat sink to be increased over extruded fin type heat sinks, these methods also have significant drawbacks. Both cast and cross cut pins are limited in their spacing by the limitations of the casting and extrusion processes, respectively. In addition, each requires a significant investment in tooling to create new parts, essentially limiting design variability and heat sink customization.

Accordingly, there is a need for a heat sink, and a method of fabricating a heat sink, that allows high aspect ratios to be achieved, does not require the use of large, noisy, and expensive presses to join fins to base units, does not suffer from significant conduction losses through the base to the fins, does not tend to lift fins from their respective base units, does not create discontinuities in the fin to base joints that promote corrosion and decrease thermal contact, does not require the use of extruded fins or base plates, and does not require a large initial investment in equipment.

SUMMARY OF THE INVENTION

The present invention is a heat sink, and method of making a heat sink, for cooling at least one heat-generating device. In its most basic embodiment, the heat sink of the present invention includes a plurality of substantially planar fins, each of substantially uniform thickness, which are stacked together in alternating relation to one another. Each fin includes a base portion, a top portion, a fin side and a base side, with the base portion of each fin being joined to the base portions of adjacent fins to form a substantially planar surface. The base side of each fin is dimensioned to form a space between the top portions of adjoining fins, the space being of a dimension that is substantially equal to the thickness of the fin.

In the preferred embodiment of the invention, each of the fins has at least one opening that is aligned with the openings in the other fins to form at least one passage through the fins. A heat spreader, such as heat pipe, is then disposed through the passage in order to effectively conduct heat from the device to the fins for convection into the air.

The preferred embodiment of the heat sink also includes a pair of fixturing rods that pass through channels through the fins formed by aligning additional openings in the fins in a manner similar in that described above with reference to the heat spreader.

In some embodiments or the invention, a base plate is joined to the base portions of the stacked fins. In those embodiments utilizing a base plate, it is preferred that the base plate include a recessed portion and at least two walls extending from the recessed portion. Preferably, the recessed portion is dimensioned to accept the base portions of the stacked fins and the two walls are dimensioned to abut the fin sides of the plurality of fins.

In still other embodiments, a pair of end plates is mounted in parallel relation to a pair of outermost fins. These end plates may be attached to the fins via the fixturing rods, in a manner similar to that described herein, may attach via screws within bores formed in the base plate, or may attach to a base plate to which the fins are joined.

In still other embodiments, a fan is attached to the heat sink in such a manner as to impinge air upon the top portions of the fins, or to draw air upward through the spaces formed between the top portions of the fins. Such a fan may be attached to the heat sink via the end plates described above, via direct attachment to the fins, or via a cover that is mounted to the top portions of the fins.

Finally, some embodiments of the heat sink include a retainer for assisting in holding the fins in proper relation to one another. In the preferred embodiments utilizing such a retainer, the fins each have a notch in their base portion that are aligned to form a channel into which the retainer is disposed.

In its most basic form, the method of manufacturing a heat sink of the present invention includes the steps of forming a plurality of substantially planar fins of a substantially uniform thickness such that each fin has a base portion, a top portion, a fin side, and such that the base side is dimensioned to form a space between the top portions of adjoining fins. Stacking the fins together in alternating relation such that the base side of the each of the plurality of fins abuts a fin side of another of the plurality of fins and such that the abutted base portions form a mounting surface for mounting the heat-generating device. Finally, the stacked fins are joined together to form the heat sink.

In the preferred method, the forming step involves forming each of the plurality of fins such that at least one opening disposed therethrough, the stacking step involves the step of aligning each of the fins such that the openings in each fin are aligned to form at least one passage through the fins, and a heat spreader is disposed through each passage.

In the preferred method, the forming step also includes forming each of the plurality of fins such that at least two openings are disposed therethrough, the stacking step also includes the step of aligning each of the fins such that each of the openings in each fin are aligned to form at least two passages through the fins, and the joining step includes the step of disposing at least two fixturing rods through the at least one passage for holding each of the plurality of fins in stacked relation to other fins.

In some embodiments of the method, the joining step also includes the step of joining a base plate the base portions of the plurality of fins. In others, the step of mounting a pair of end plates in parallel relation to a pair of outermost fins is included. In still others, the forming step includes the step of forming a notch in the base portion of each fin, the stacking step includes the step of aligning each notch of each of the plurality of fins such that each notch of each fin is aligned to form a channel through the fins, and the joining step includes the step of disposing a retainer within the channel.

In the preferred method, the joining step includes the steps of disposing a joining material between each of the plurality of fins and heating the fins and the joining material such that the fins are joined together. In some embodiments, the joining material is a brazing paste containing a substantially non-corrosive flux material, and the disposing step includes spreading the brazing paste between the fins. In others, the joining material is a brazing sheet and the heating step is performed in an oxygen free atmosphere. In still others, the joining material is a brazing sheet and the joining step includes the step of disposing flux between the fins prior to disposing the joining material. In these embodiments, it is preferable to further perform the step of cleaning residual flux from the heat sink following the heating step.

Therefore, it is an aspect of the invention to provide a heat sink and method for manufacturing a heat sink that allows for higher fin densities than can be achieved through typical extruding processes.

It is a further aspect of the invention to provide a heat sink that does not suffer from significant conduction losses through the base to the fins.

It is a further aspect of the invention to provide a method for manufacturing a heat sink that does not require the use of large, noisy, and expensive presses to join fins or pins to base units.

It is a further aspect of the invention to provide a method for manufacturing a heat sink that does not tend to lift fins or pins from their respective base units.

It is a further aspect of the invention to provide a method for manufacturing a heat sink that does not create discontinuities in the fin to base joints that promote corrosion and decrease thermal contact.

It is a further aspect of the invention to provide a method for manufacturing a heat sink that does not require the use of extruded fins or base plates.

It is a further aspect of the invention to provide a method for manufacturing a heat sink that results in a heat sink that may be anodized.

It is a still further aspect of the invention to provide a method for manufacturing a heat sink that does not require a large initial investment in equipment.

These aspects of the invention are not meant to be exclusive and other features, aspects, and advantages of the present invention will be readily apparent to those of ordinary skill in the art when read in conjunction with the following description, appended claims and accompanying drawings.

DETAILED DESCRIPTION OF THE INVENTION

Figure 1:
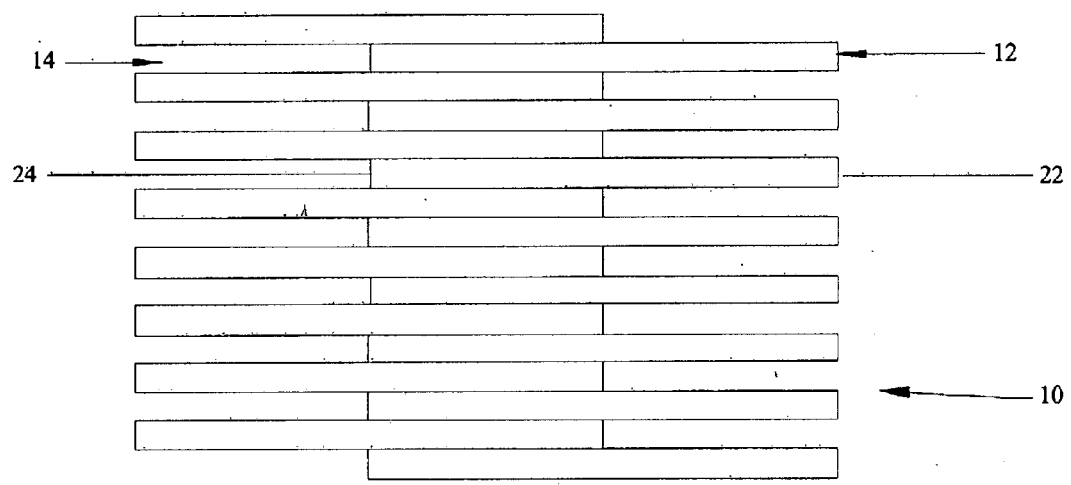
FIG. 1 is a top view of the preferred embodiment of the heat sink of the present invention.
Figure 2:
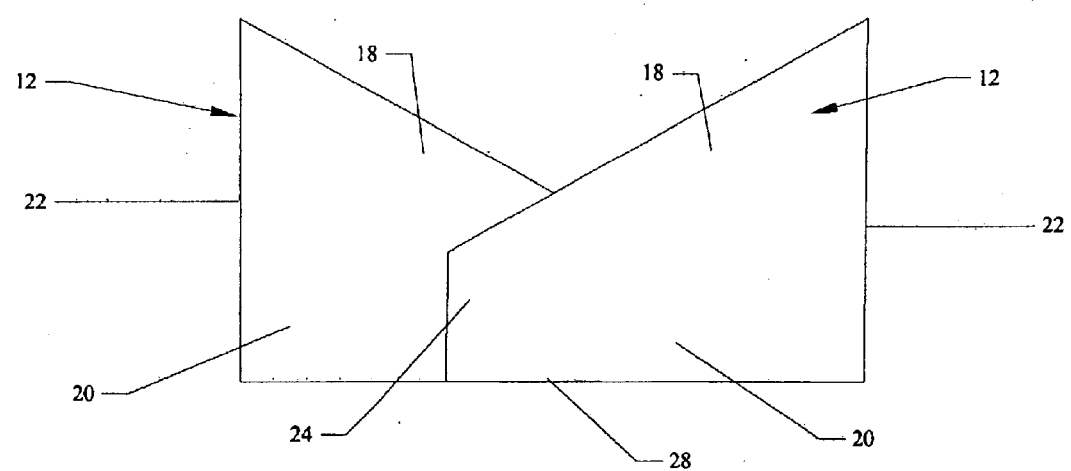
FIG. 2 is a front view of the heat sink of FIG. 1.

Referring first to FIGS. 1 and 2, the basic embodiment of the heat sink 10 of the present invention is shown. The basic embodiment includes a plurality of fins 12, each of substantially uniform thickness, which are stacked together in alternating relation to one another. Each fin 12 includes a base portion 20, a top portion 18, a fin side 22 and a base side 24, with the base portion 20 of each fin being joined to the base portion 20 of adjacent fins 12 to form a substantially planar surface 28. The base side 24 each of fin 12 is dimensioned to form a space 14 between the top portions 18 of adjoining fins 12. The space 14 between each fin 12 is of a dimension that is substantially equal to the thickness of the fin 12 whose base portion 20 forms the space 14.

In the preferred embodiment, the fins 12 are manufactured from a high conductivity aluminum alloy, such as 1050 or 1100 alloy. However, it is recognized the other art recognized conductive materials, such as other aluminum alloys, copper, may be substituted for the preferred aluminum alloys to achieve similar results. The dimension of each fin is substantially uniform, and is preferably between 0.020 inches and 0.032 inches, but could be thicker or thinner depending upon the particular application. In the preferred embodiment, each fin 12 is of substantially the same cross sectional thickness. However, other embodiments may utilize fins 12 of differing thicknesses to form spaces 14 of differing widths, provided that the thickness of each individual fin 12 is substantially uniform.

As shown in FIGS. 1 & 2, the fins 12 are preferably all formed into the same shape and are alternated in stacking relation such that the base sides 24 of each fin 12 overlap with fin sides 22 of adjoining fins 12. However, fins having differing profiles may likewise be utilized, provided that the base portions are dimensioned to join together and the base sides 24 of each fin are dimensioned to form the required space 14 between adjoining fins 12.

Figure 3:
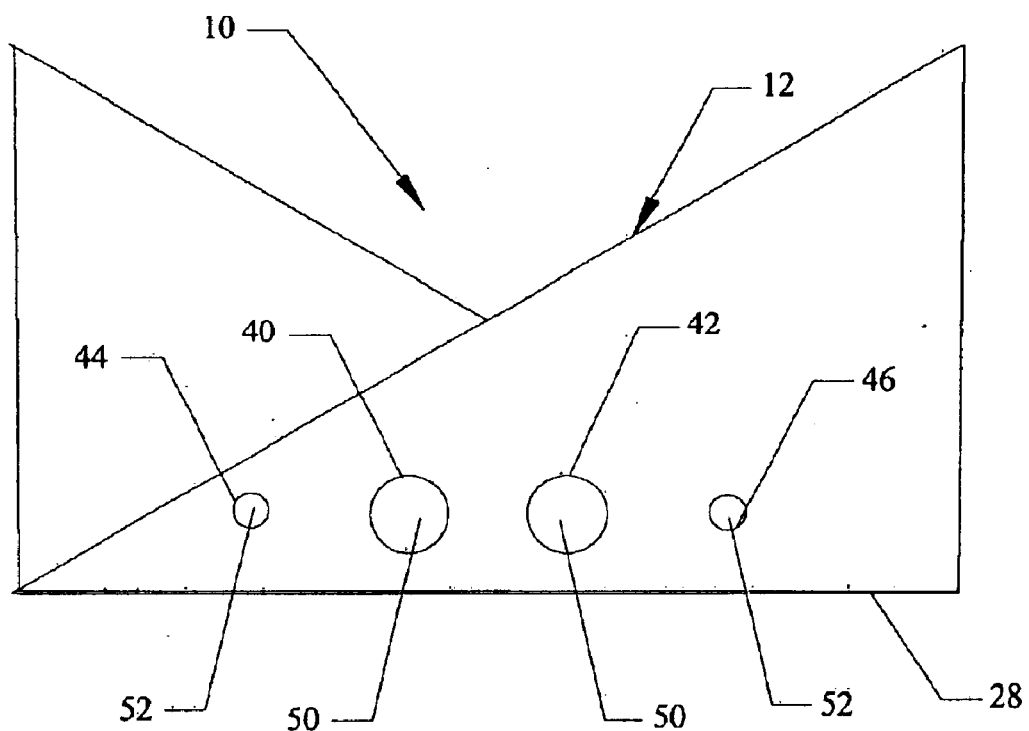
FIG. 3 is a front view of an alternative embodiment of a heat sink of the present invention that includes heat pipes and fixturing rods disposed through its base.
Figure 4:
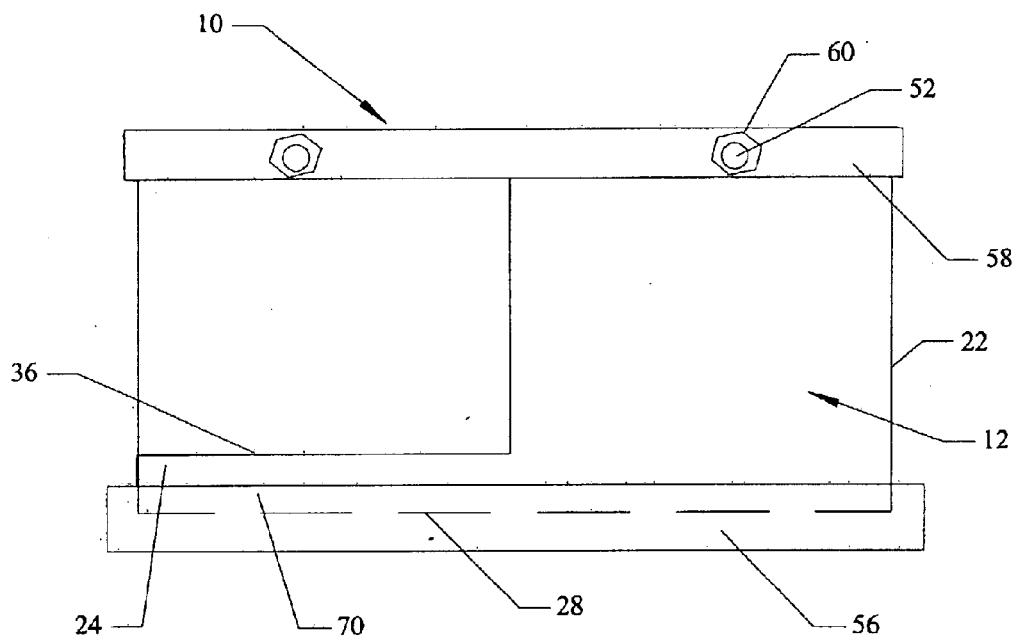
FIG. 4 is a side view of an alternative embodiment of the heat sink of the present invention in which the stacked fins are joined to a base and a cover is attached to the top portions of the fins via fixturing rods.
Figure 5:
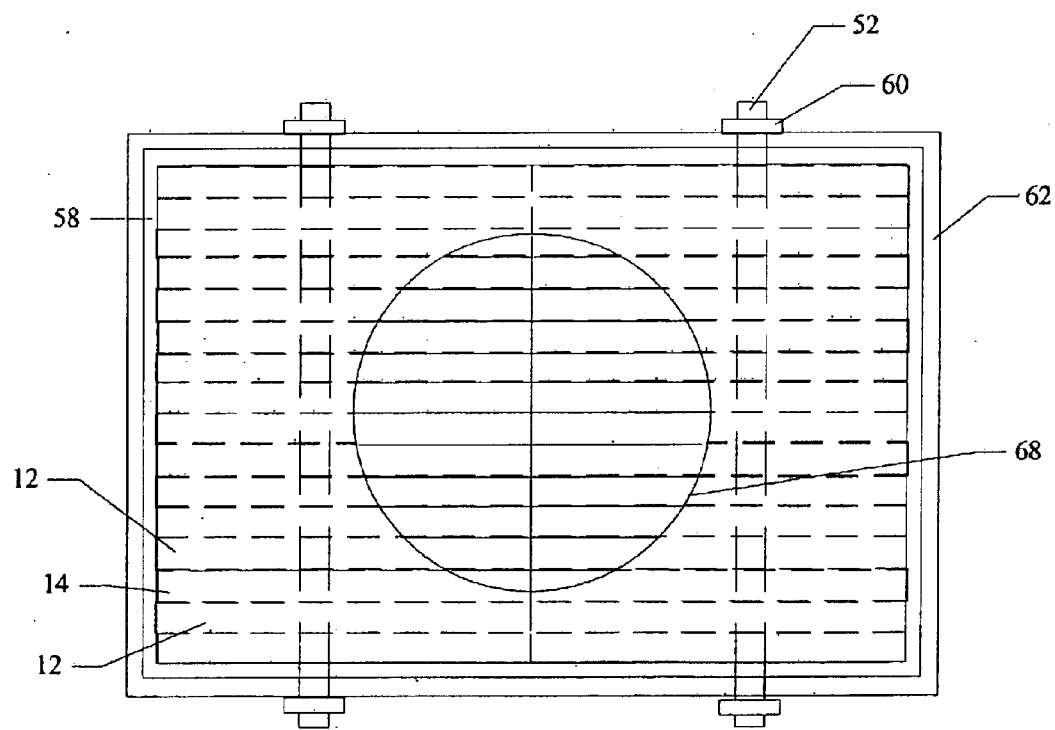
FIG. 5 is a top view of the heat sink of FIG. 4 with the fins and fixturing rods shown as phantom lines and with the cover shown as having a hole for mounting a cooling fan.

The base sides 24 of the fins 12 may take many forms, and may be aligned in a variety of arrangements. For example, in the embodiment shown in FIGS. 1 and 2, the top portions 18 of the fins 12 are formed in a triangular shape, the bottom portions 20 are is formed in a rectangular shape, and the fins 12 are stacked such that the base sides 24 of each fin do not extend to the boundaries of the fin sides 22 of the adjoining fins 12. In the embodiment shown in FIG. 3, the fins 12 are formed as full triangles, with the base portions 20 and top portions 18 of each fin 12 mating along the hypotenuse of the triangle. As shown in FIG. 3, the base sides 24 extend fully to the boundaries of the fin sides 22 of the adjoining fins 12. However, it is recognized that these, too, could be aligned such that the base sides 24 extended in a manner similar to those shown in FIGS. 1 and 2, or varied in a manner similar to that of the embodiment of FIG. 6. Finally, as shown in the embodiment of FIGS. 4 and 5, the base sides 24 and fin sides 22 can be stepped such that the base sides 24 form a substantially planar bottom 36 to each space 14 between adjoining fins 12.

Referring again to FIGS. 1 and 2, all embodiments of the heat sink 10 are manufactured using the method of the present invention. The basic method includes the step of forming the fins 12 of a substantially uniform thickness such that each fin has a base portion 20, a top portion 18, a fin side 22 and a base side 24, and such that the base side 24 is dimensioned to form a space between the top portions 18 of adjoining fins 12. The fins 12 are then stacked together in alternating relation such that the base side 24 of each fin 12 abuts a fin side 22 of adjoining fins 12 and such that the abutted base portions 20 form a mounting surface 28 for mounting the heat-generating device (not shown). Finally, the stacked fins are joined together to form the heat sink.

In the preferred method, the joining step includes the steps of disposing a joining material (not shown) between each fin 12 and heating the fins 12 and the joining material such that the fins 12 are joined together. In some embodiments, the joining material is a brazing paste containing a substantially non-corrosive flux material, and the disposing step includes spreading the brazing paste between the fins.

In other embodiments, the joining material is a brazing sheet (not shown) and the heating step is performed in an oxygen free atmosphere. This may be accomplished via vacuum brazing, conveyor brazing in an inert gas atmosphere, such as argon, or in other art recognized process for preventing oxidation.

In still other embodiments, the joining material is a brazing sheet (not shown) and the joining step includes the step of disposing flux (not shown) between the fins 12 prior to disposing the joining material. In these embodiments, it is preferable to further perform the step of cleaning residual flux from the heat sink following the heating step. This cleaning step is preferred as it insures that any corrosive flux residue is removed from the part, preventing later oxidation and accompanying degradation of the braze joints. Referring now to FIG. 3, another embodiment of the heat sink 10 of the present invention is shown. As noted above, the fins 12 of this embodiment are substantially triangular shape, but are arranged in a alternating manner similar to that described with reference to FIGS. 1 and 2. In this embodiment, four openings 40, 42, 44, 46 are disposed through each fin 12 and each is aligned with the others to form four passages through the stacked fins 12.

The passages formed by openings 40, 42 are dimensioned to accommodate heat spreaders 50. These heat spreaders 50 may be any art recognized means for efficiently transferring heat, but are preferably conventional heat pipes or slugs of highly conductive metals, such as copper or aluminum, and may be of many cross sectional shapes, including the preferred circular shape shown in FIG. 3. Regardless of their type and shape, the heat spreaders 50 are preferably press fit within the openings 40, 42 to reduce interface resistances between the spreader 50 and the individual fins 12. However, in some embodiments, the heat spreaders 50 may be soldered, brazed, or otherwise mechanically joined to the fins 12. In others, any gaps between the heat spreaders 50 and the fins 12 are filled with a thermally conductive material, such as thermal grease, to further reduce interface resistances.

The passages 44, 46 are dimensioned to accommodate fixturing rods 52, which extend through the fins 12 and are fastened together to hold the fins 12 in stacked relation to one another. Fixturing rods 52 may take many forms, but are preferably threaded rods that are dimensioned to extend slightly beyond the outermost fins 12 such that mechanical fasteners, such a nuts (not shown) may be attached thereto. In some embodiments, however, these fixturing rods 52 may be dimensioned to accept clips, rivets, or other art recognized fastening means.

In some embodiments utilizing the fixturing rods 52, the joining step of the method of manufacture is accomplished by simply attaching the fixturing rods 52 to the fins 12 such that the fins 12 are compressed together. In such embodiments, it is preferred that a conductive material, such as thermal grease, thermally conductive interface pad, or the like, is disposed between each fin to promote thermal contact therebetween. However, due to the fact that heat may be conducted directly from the bottom surface 28 into the individual fins 12, the conduction between fins 12 is not as critical as in other applications and, therefore, this step of applying such an interface material may be omitted. In other embodiments, the fixturing rods 52 are attached to the fins 12 after a joining material has been applied between the fins 12 and before the heating step. In these embodiments, the fixturing rods 52 serve as the fixturing means for holding the fins 12 together in stacked relation during the brazing process. The rods 52 may then be removed, or left as part of the finished heat sink 10, depending upon the type of rod 52 used and the desire of the end user.

Referring now to FIGS. 4 and 5, another embodiment of the heat sink 10 of the present invention is shown. As noted above, the base sides 24 and fin sides 22 in this embodiment are be stepped such that the base sides 24 form a substantially planar bottom 36 to each space 14 between adjoining fins 12. In this embodiment, the substantially planar surface 28 formed by the base portions 20 of the stacked fins 12 is mounted within a recess 70 in a base plate 56. The base plate 56 is preferably manufactured of the same material as the fins 12 and includes at least two walls 62 that act to restrain movement of the fins 12.

The embodiment of FIGS. 4 and 5 also includes a cover 58 that is attached to the top portions 18 of the fins. The cover 58 is preferably manufactured of a material, such as sheet metals, plastics, or the like, that are inexpensively formed and are readily adapted to mount a fan (not shown), blower, or other air handling device. The cover 58 is dimensioned to fit over, and restrain the movement of, the top portions 18 of the fins, and preferably includes an opening 58 therethrough to place air from, or drawn to, the air handling device into fluid communication. In the embodiment of FIGS. 4 and 5, the cover 58 is attached to the fins 12 via a pair of threaded fixturing rods 52 that are retained by nuts 60. However, it is recognized that other art recognized means for attaching sheet metal or plastic parts may be substituted to achieve similar results.

In the method of manufacturing the heat sink of FIGS. 4 and 5, the steps of forming the fins 12 and aligning them in alternating relation is similar in all respect to the method discussed with reference to FIGS. 1 and 2. However, due to the addition of the base plate 56, the additional step of joining the base plate 56 to the stacked fins 12 is also included. In some embodiments, the aligning step involves aligning the fins 12 within the recess 70 in the base plate 56 until all fins 12 are stacked and held together between the walls 62 of the base plate 56. In others, the fins 12 are pre-stacked and the stacked fins 12 are fitted within the recess 70 or, in cases where a substantially flat base plate 56 is utilized, disposed directly upon the top surface of the base plate 56. The method of manufacturing the heat sink of FIGS. 4 also includes the steps of forming and attaching the cover 58 to the top portions 18 of the fins 12. As noted above, this step involves art-recognized methods and, therefore, requires no elaboration.

Because the stacked fins 12 of this embodiment are effectively joined mechanically by the base plate 56 and cover 58, the heat sink of FIGS. 4 and 5 need not be brazed and may, instead, utilize the joining methods described with reference to FIG. 3. However, it is preferred that the base plate 56 be joined to the bottom surface 28 formed by the stacked fins 12. This is preferably accomplished via the same brazing techniques described above, which are preferably performed after the base plate and cover 58 have been attached. However, it is understood that other joining methods, such as bonding using the thermally conductive epoxies described above, may be substituted to achieve poorer, though often acceptable, results.

Figure 6:
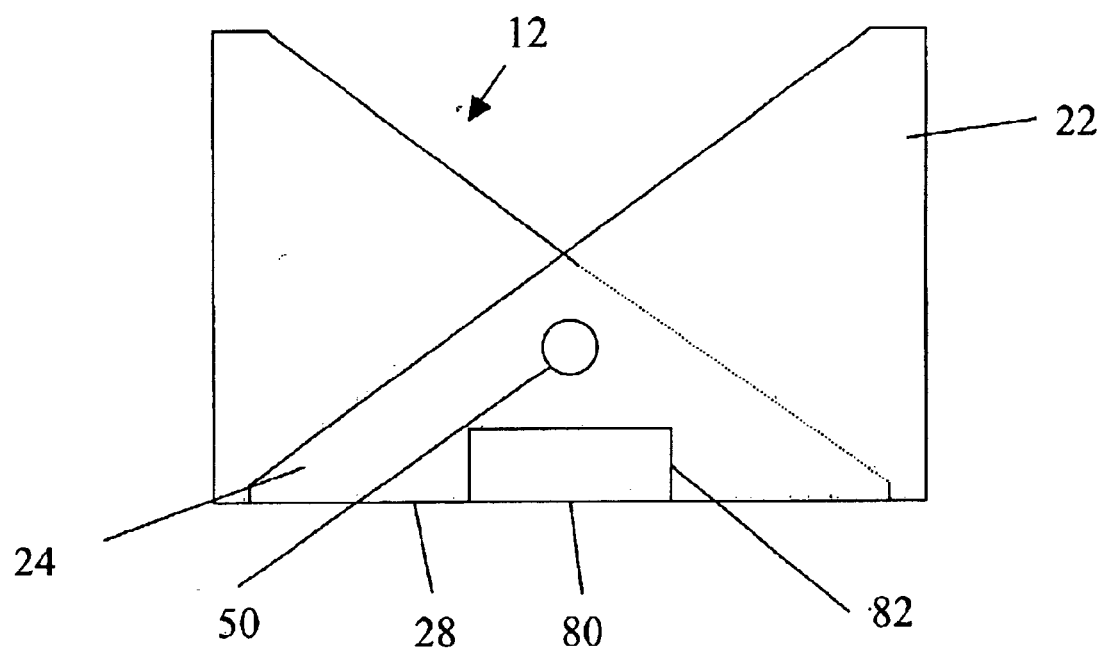
FIG. 6 is a side view an alternative embodiment of the heat sink of the present invention in which a retainer is disposed within a channel formed by notches in the base portions of the fins.
Figure 7:
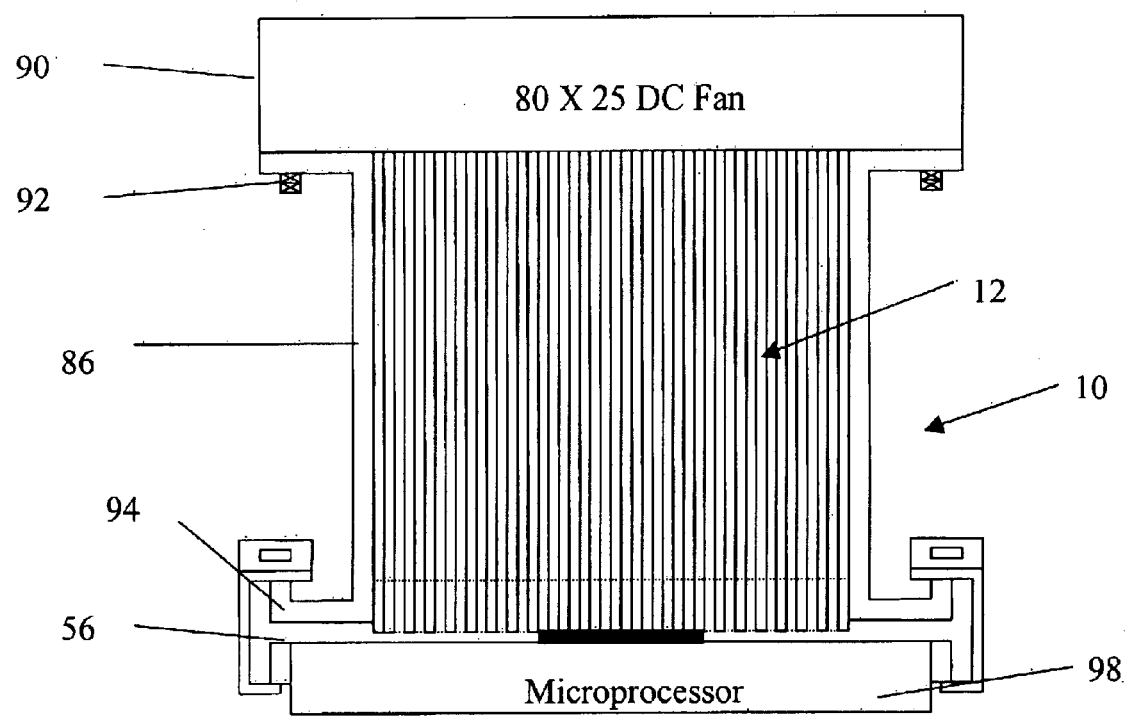
FIG. 7 is a side view of the one embodiment of heat sink of the present invention including a fan mounted to end plates and a heat-generating microprocessor attached to a base plate.

Referring now to FIG. 6, still another embodiment of the present invention is shown. This embodiment is similar in many respects to that described with reference to FIG. 3, as it includes triangular fins 12 and has a heat spreader 50 disposed therethrough. However, the embodiment of FIG. 6 also includes a retainer 80 that is disposed within a passage formed by notches 82 in the fins and acts to prevent lateral and vertical movement of the fins 12. The retainer 80 shown in FIG. 7 is substantially rectangular. However, it is recognized that the retainer 80, and mating notches 82, may have a variety of cross sections. For example, the notches 82 may form a dovetail shaped passage that mates with a dovetail shaped retainer 80 to provide enhanced retention of the fins 12. Likewise, the retainer 80 may be manufactured from a variety of materials. In embodiments, such as that of FIG. 6, where a heat spreader 50 is utilized, the retainer 80 may be manufactured of a polymer, rubber, plastic, or other non-conductive material. In others, the retainer 80 is formed of a highly conductive material and may be likewise utilized as a combination heat spreader and retainer.

The method of manufacturing the embodiment of FIG. 6 is similar in all respects to the method described with reference to FIGS. 1 and 2, with the addition of the forming of notches within the fins, the alignment of the notches to form a channel, and the disposition of the retainer within the channel. In such embodiments where the fins 12 are brazed together, it is envisioned that the fins will be separately fixtured prior to the brazing process and the fixtures removed after cooling of the brazed heat sink.

Referring now to FIG. 7, still another embodiment of the heat sink 10, utilizing a base plate 56, a pair of end plates 86 and a fan 88, is shown mounted to a microprocessor 98. In this embodiment, the end plates 86 are mounted in parallel relation to each other and to the outermost fins 12 and are attached at one end to the base plate 56 and at the other end to the fan 90.

As shown in FIG. 7, the end plates 86 are mounted to the fan 90 using conventional screws 92 and to the base plate 56 via clamping details 94 formed therein. However, it is recognized that the end plates 86 may be mounted to the fins 12 and base plate 56 via brazing, threaded fixturing rods (not shown), or via other art recognized means. Similarly, it is recognized that a cover (not shown), such as that described with reference to FIGS. 4 and 5 could likewise be attached to the end plates 86 to allow for mounting of the fan 90.

As shown in FIG. 7, the heat generating device for which the heat sink 10 of the present invention was design is a microprocessor 98, such as a Pentium 4® or Pentium 5® microprocessor, such as those manufactured by the Intel Corporation. When used with such a microprocessor 98, the heat sink 10 is typically 2.5 inches in width, 1.5 inches in height, and 3.5 inches in length and the fan is typically a 35 CFM fan 90. Under these conditions, a heat sink 10 having 0.020 thick fins has a thermal resistance of 0.2 Deg. C./Watt. However, heat sinks 10 for use with other heat generating devices will likely have different dimensions, utilize different fans, and have different thermal resistances.

Although the present invention has been described in considerable detail with reference to certain preferred versions thereof, other versions would be readily apparent to those of ordinary skill in the art. Therefore, the spirit and scope of the appended claims should not be limited to the description of the preferred versions contained herein.

What is claimed is:

1. A method of manufacturing a heat sink for cooling at least one heat generating device, said method comprising the steps of:
    forming a plurality of substantially planar fins such that each of said plurality of fins is of substantially uniform thickness and comprises a base portion, a top portion, a fin side and a base side dimensioned to form a space between said top portions of adjoining fins;
    stacking said plurality of fins together in alternating relation such that said base side of each of said plurality of fins abuts a fin side of another of said plurality of fins and such that said abutted base portions of each of said plurality of fins form a mounting surface for mounting said heat generating device; and
    joining said stacked plurality of fins together to form said heat sink.

2. The method as claimed in claim 1:
    wherein said forming step further comprises forming each of said plurality of fins such that at least one opening disposed therethrough;
    wherein said stacking step further comprises the step of aligning each of said fins such that said at least one opening of each fin is aligned to form at least one passage through said fins; and
    wherein said method further comprises the step of disposing at least one heat pipe through said at least one passage.

3. The method as claimed in claim 1:
    wherein said forming step further comprises forming each of said plurality of fins such that at least two openings are disposed therethrough;
    wherein said stacking step further comprises the step of aligning each of said fins such that each of said at least two openings of each fin are aligned to form at least two passages through said fins; and
    wherein said joining step comprises the step of disposing at least two fixturing rods through said at least one passage for holding each of said plurality of fins in stacked relation to others of said plurality of fins.

4. The method as claimed in claim 1 wherein said joining step further comprises joining a base plate to said base portions of said plurality of fins.

5. The method as claimed in claim 1 further comprising the steps of mounting a pair of end plates in parallel relation to a pair of outermost fins.

6. The method as claimed in claim 1:
    wherein said forming step further comprises the step of forming a notch in said base portion of each of said plurality of fins;
    wherein said stacking step further comprises the step of aligning each notch of each of said plurality of fins such that each notch of each fin is aligned to form a channel through said fins; and
    wherein said joining step comprises the step of disposing a retainer within said channel.

7. The method as claimed in claim 1 wherein said joining step comprises the steps of disposing a joining material between each of said plurality of fins and heating said fins and said joining material such that said fins are joined together.

8. The method as claimed in claim 7 wherein said joining material is a brazing paste comprising a substantially non-corrosive flux material, and wherein said disposing step comprises spreading said brazing paste between said fins.

9. The method as claimed in claim 7 wherein said joining material is a brazing sheet and wherein heating step is performed in an oxygen free atmosphere.

10. The method as claimed in claim 7 wherein said joining material is a brazing sheet and wherein said joining step further comprises the step of disposing flux between said fins prior to disposing said joining material.

11. A heat sink for cooling at least one heat generating device, said heat sink prepared by the steps of:

forming a plurality of substantially planar fins such that each of said plurality of fins is of substantially uniform thickness and comprises a base portion, a top portion, a fin side and a base side dimensioned to form a space between said top portions of adjoining fins;

stacking said plurality of fins together in alternating relation such that said base side of said each of said plurality of fins abuts a fin side of another of said plurality of fins and such that said abutted base portions of each of said plurality of fins form a mounting surface for mounting said heat generating device; and joining said stacked plurality of fins together to form said heat sink.

12. The heat sink as claimed in claim 11:

wherein said forming step further comprises forming each of said plurality of fins such that at least one opening disposed therethrough;

wherein said stacking step further comprises the step of aligning each of said fins such that said at least one opening of each fin is aligned to form at least one passage through said fins; and wherein said method further comprises the step of disposing at least one heat pipe through said at least one passage.

13. The heat sink as claimed in claim 11:

wherein said forming step further comprises forming each of said plurality of fins such that at least two openings are disposed therethrough;

wherein said stacking step further comprises the step of aligning each of said fins such that each of said at least two openings of each fin are aligned to form at least two passages through said fins; and wherein said joining step comprises the step of disposing at least two fixturing rods through said at least one passage for holding each of said plurality of fins in stacked relation to others of said plurality of fins.

14. The heat sink as claimed in claim 11 wherein said joining step further comprises joining a base plate to said base portions of said plurality of fins.

15. The heat sink as claimed in claim 11 further comprising the steps of mounting a pair of end plates in parallel relation to a pair of outermost fins.

16. The heat sink as claimed in claim 11:

wherein said forming step further comprises the step of forming a notch in said base portion of each of said plurality of fins;

wherein said stacking step further comprises the step of aligning each notch of each of said plurality of fins such that each notch of each fin is aligned to form a channel through said fins; and wherein said joining step comprises the step of disposing a retainer within said channel.

17. The heat sink as claimed in claim 11 wherein said joining step comprises the steps of disposing a joining material between each of said plurality of fins and heating said fins and said joining material such that said fins are joined together.

18. The heat sink as claimed in claim 17 wherein said joining material is a brazing paste comprising a substantially non-corrosive flux material, and wherein said disposing step comprises spreading said brazing paste between said fins.

19. The heat sink as claimed in claim 17 wherein said joining material is a brazing sheet and wherein heating step is performed in an oxygen free atmosphere.

20. The heat sink as claimed in claim 9 wherein said joining material is a brazing sheet and wherein said joining step further comprises the step of disposing flux between said fins prior to disposing said joining material.

* * * * *